United States Patent
Yoshida et al.

(10) Patent No.: US 12,356,543 B2
(45) Date of Patent: Jul. 8, 2025

(54) WIRING MODULE

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Shinichiro Yoshida, Osaka (JP); Osamu Nakayama, Osaka (JP); Kotaro Takada, Osaka (JP)

(73) Assignees: SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 181 days.

(21) Appl. No.: 18/275,300

(22) PCT Filed: Feb. 2, 2022

(86) PCT No.: PCT/JP2022/003928
§ 371 (c)(1),
(2) Date: Aug. 1, 2023

(87) PCT Pub. No.: WO2022/176609
PCT Pub. Date: Aug. 25, 2022

(65) Prior Publication Data
US 2024/0107663 A1    Mar. 28, 2024

(30) Foreign Application Priority Data
Feb. 22, 2021    (JP) .................. 2021-026268

(51) Int. Cl.
*H05K 1/02*    (2006.01)
*B60R 16/02*    (2006.01)
*H05K 3/20*    (2006.01)

(52) U.S. Cl.
CPC ........ *H05K 1/028* (2013.01); *B60R 16/0207* (2013.01); *H05K 3/20* (2013.01); *H05K 2201/10181* (2013.01)

(58) Field of Classification Search
None
See application file for complete search history.

(56) References Cited

U.S. PATENT DOCUMENTS 6,449,836 B1 *    9/2002    Miyake .................. H05K 3/363
                                                228/180.1
12,272,293 B2 *    4/2025    Choi .................... G09G 3/3233
(Continued)

FOREIGN PATENT DOCUMENTS

JP    2007-317990    12/2007
JP    2017-011191    1/2017
(Continued)

OTHER PUBLICATIONS

International Search Report issued in WIPO Patent Application No. PCT/JP2022/003928, dated Apr. 26, 2022, along with an English translation thereof.

*Primary Examiner* — Krystal Robinson
(74) *Attorney, Agent, or Firm* — GREENBLUM & BERNSTEIN, P.L.C.

(57) ABSTRACT

A wiring module including a flexible printed wiring board to be electrically connected to a plurality of power storage elements, wherein the flexible printed wiring board includes: a base film that has insulating properties and has a first surface and a second surface; an adhesive layer that has adhesive properties and is stacked onto the first surface of the base film; a conductive path that is stacked onto the first surface of the base film using the adhesive layer; and a coverlay that is stacked onto the first surface of the base film using the adhesive layer, and covers the first surface of the base film and the conductive path, the conductive path has (Continued)

a fuse portion forming a part of a circuit and having a smaller cross-sectional area than another part of the conductive path, and a resin portion that includes a synthetic resin with insulating properties.

7 Claims, 9 Drawing Sheets

(56) References Cited

U.S. PATENT DOCUMENTS

| | | | |
|---|---|---|---|
| 2014/0102771 A1* | 4/2014 | Kajiya | H05K 1/028 174/254 |
| 2018/0192511 A1* | 7/2018 | Tsumagari | H01H 85/046 |
| 2019/0006141 A1* | 1/2019 | Tsumagari | H05K 1/0296 |
| 2020/0022260 A1* | 1/2020 | Takamatsu | H01M 50/519 |
| 2022/0190392 A1 | 6/2022 | Takahashi et al. | |

FOREIGN PATENT DOCUMENTS

| | | |
|---|---|---|
| JP | 2017-011253 | 1/2017 |
| WO | 2020/184564 | 9/2020 |

* cited by examiner

WIRING MODULE

TECHNICAL FIELD

The present disclosure relates to a wiring module.

BACKGROUND ART

Flexible printed wiring boards are widely used to form electric circuits in electronic devices and the like. Flexible printed wiring boards are formed by using an adhesive to adhere a conductive pattern to an insulative film made of a synthetic resin with insulating properties. The insulative film and the conductive pattern are covered by an insulator coating adhered thereto using an adhesive. In order to prevent damage to electronic components in electronic devices or the like caused by an overcurrent, it may be desirable to provide a fuse that melts when exposed to an overcurrent and thus blocks the current. Thus, there are cases where a fuse is mounted on a flexible printed wiring board.

Mounting a fuse on a flexible printed wiring board increases the number of components and mounting steps, which in turn increases the cost of the flexible printed wiring board. Thus, a proposal has been made to impart a fuse function by partially reducing the cross-sectional area of a circuit constituted by a conductive pattern of the flexible printed wiring board so as to melt when subjected to an overcurrent (see JP 2007-317990A).

CITATION LIST

Patent Documents

Patent Document 1: JP 2007-317990A

SUMMARY OF INVENTION

Problem to be Solved

In the configuration of the flexible printed wiring board disclosed in the above Patent Document 1, the surrounding region of the fuse may reach a high temperature when the fuse melts, which may lead to carbonization of or damage to the insulative film or the insulator coating. Thus, the melted fuse may be exposed from the insulative film or the insulator coating. Even when the fuse has melted, if moisture adheres to the portion of the fuse exposed from the insulative film or the insulator coating, there is a possibility that the melted fuse will create a short-circuit via the moisture.

The present disclosure was completed based on the above circumstances, and it is an object thereof to provide a wiring module that can suppress short-circuiting of a fuse portion melted by an overcurrent.

Solution to Problem

The present disclosure is a wiring module including a flexible printed wiring board to be electrically connected to a plurality of power storage elements, wherein the flexible printed wiring board includes: a base film that has insulating properties and has a first surface and a second surface; an adhesive layer that has adhesive properties and is stacked onto the first surface of the base film; a conductive path that is stacked onto the first surface of the base film using the adhesive layer; and a coverlay that is stacked onto the first surface of the base film using the adhesive layer, and covers the first surface of the base film and the conductive path, the conductive path has a fuse portion forming a part of a circuit and having a smaller cross-sectional area than another part of the conductive path, and a resin portion that includes a synthetic resin with insulating properties is formed on a portion of the second surface of the base film that corresponds to the fuse portion, and on a portion of an outer surface of the coverlay that corresponds to the fuse portion.

Advantageous Effects of Invention

With the present disclosure, short-circuiting of a fuse portion melted by an overcurrent can be suppressed.

EMBODIMENTS OF THE INVENTION

Description of Embodiments of Disclosure

Figure 1:
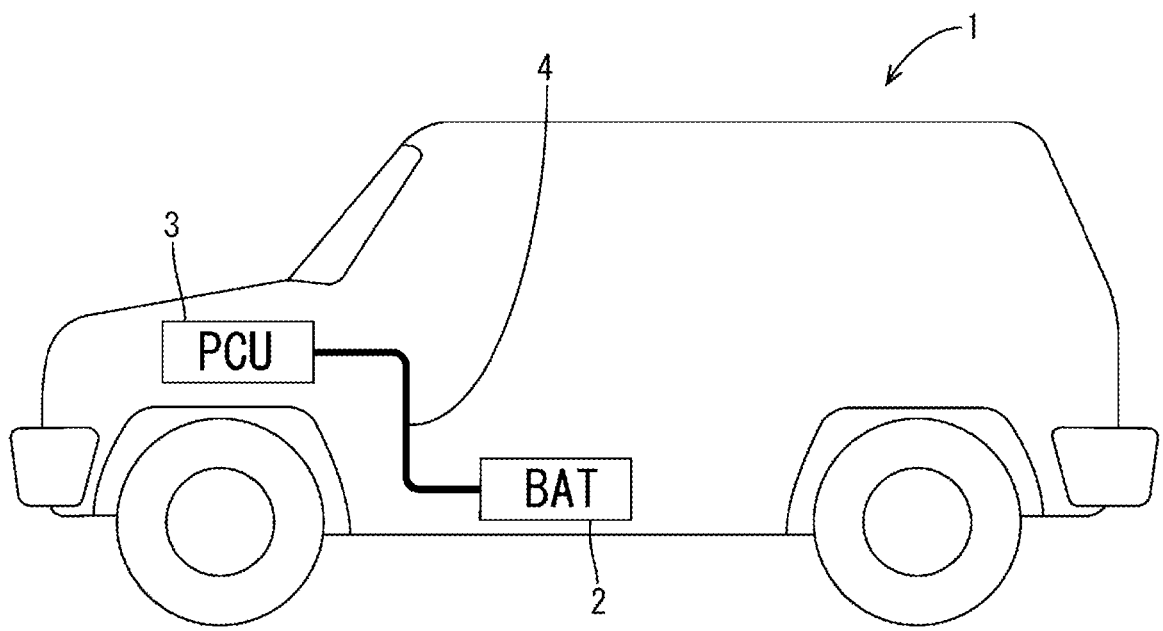
FIG. 1 is a schematic view of a vehicle in which a wiring module according to Embodiment 1 is mounted.

First, embodiments of the present disclosure will be listed and described.

(1) The present disclosure is a wiring module including a flexible printed wiring board to be electrically connected to a plurality of power storage elements, wherein the flexible printed wiring board includes: a base film that has insulating properties and has a first surface and a second surface; an adhesive layer that has adhesive properties and is stacked onto the first surface of the base film; a conductive path that is stacked onto the first surface of the base film using the adhesive layer; and a coverlay that is stacked onto the first surface of the base film using the adhesive layer, and covers the first surface of the base film and the conductive path, the conductive path has a fuse portion forming a part of a circuit and having a smaller cross-sectional area than another part of the conductive path, and a resin portion that includes a synthetic resin with insulating properties is formed on a portion of the second surface of the base film that corresponds to the fuse portion, and on a portion of an outer surface of the coverlay that corresponds to the fuse portion.

When an overcurrent flows through the fuse portion, the temperature of the fuse portion increases, thus melting the fuse portion. At this time, the temperature of the fuse portion rises to a temperature that substantially coincides with the melting point of the metal forming the fuse portion. Thus, carbonization of or damage to the base film or the coverlay is of concern. With the present disclosure, the resin portion is formed on the portion of the second surface of the base film that corresponds to the fuse portion, and on the portion of the outer surface of the coverlay that corresponds to the fuse portion, and thus, even if the base film or the coverlay is carbonized or damaged, the melted fuse portion is prevented from being exposed to the outside. Consequentially, it is possible to keep moisture from adhering to the melted fuse portion, and thus short-circuiting of the fuse portion melted by an overcurrent can be suppressed.

(2) It is preferable that the base film and the coverlay have at least one through hole that extends through the base film and the coverlay at a position on a lateral side of the fuse portion relative to a direction in which the fuse portion extends, and a filling resin portion that fills the through hole and is continuous with the resin portion is formed inside the through hole.

When an overcurrent flows through the fuse portion and the fuse portion melts, there are cases where a component included in the adhesive layer that has a comparatively low melting point becomes a gas, and the gas builds up between the base film and the coverlay. Thus, the gas may increase the pressure in the vicinity of the fuse portion. When the pressure in the vicinity of the fuse portion increases, the fuse portion is likely to break, and thus the fuse portion may melt at a temperature below a predetermined temperature. With the present disclosure, even if the temperature of the fuse portion increases and the components constituting the adhesive layer that are quick to vaporize become a gas, the gas is discharged into the at least one through hole formed in the base film and the coverlay. The gas discharged into the through hole is diffused into the filling resin portion, and also diffused into the resin portion that is continuous with the filling resin portion. Accordingly, an increase in the pressure in the vicinity of the fuse portion is suppressed, and thus the fuse portion can melt at a predetermined temperature.

(3) It is preferable that the through hole is formed on two lateral sides of the fuse portion.

Gas generated in the adhesive layer is discharged into the through holes formed on two sides of the fuse portion, and thus an increase in pressure in the vicinity of the fuse portion can be further suppressed.

(4) It is preferable that the flexible printed wiring board is disposed on an insulating protector made of a synthetic resin with insulating properties, the insulating protector has a bottom wall and two side walls that extend from side edges of the bottom wall, the flexible printed wiring board is disposed in a fuse housing portion formed between the bottom wall and the two side walls of the insulating protector such that the second surface of the flexible printed wiring board opposes the bottom wall, and the resin portion is disposed in the fuse housing portion.

The resin portion can be kept from flowing out from the fuse housing portion formed between the bottom wall and the two side walls. Thus, interference between the resin portion and a member disposed outside the fuse housing portion can be suppressed.

(5) It is preferable that the bottom wall of the insulating protector is provided with a groove portion that is recessed at a position that corresponds to the fuse portion, and the resin portion is disposed in the groove portion.

By disposing the resin portion in the groove portion, the second surface of the flexible printed wiring board can also be reliably covered by the resin portion.

(6) It is preferable that the resin portion has a Shore A hardness of 10 or more and 90 or less.

By making the Shore A hardness 10 or more, moldability can be ensured. By making the Shore A hardness 90 or less, the resin portion is imparted with flexibility, and it is possible to obtain an effect of avoiding a situation where the internal pressure of the resin portion is increased by a gas generated when the fuse portion melts thus causing the resin portion itself to split due to its inability to withstand the increased internal pressure. The Shore A hardness is measured based on JIS K6253.

(7) It is preferable that the wiring module is a vehicle wiring module that is to be electrically attached to the plurality of power storage elements mounted in a vehicle.

The power storage elements are used as a driving source for the vehicle, and thus have a comparatively high voltage (about 300 V, for example). The present aspect can be preferably used for such power storage elements.

Detailed Description of Embodiments of Disclosure

Embodiments of the present disclosure are described below. The present disclosure is not limited to these examples, but is indicated by the claims, and all changes that come within the meaning and range of equivalency of the claims are intended to be embraced therein.

Embodiment 1

Embodiment 1 in which the present disclosure is applied to a wiring module 20 will be described with reference to FIGS. 1 to 9. A power storage module 10 is mounted in a vehicle 1, which is an electric car, a hybrid car, or the like, and is used as a power source for driving the vehicle 1. Below, the direction indicated by the Y arrow will be described as the forward direction, the direction indicated by the X arrow will be described as the left direction, and the direction indicated by the Z arrow will be described as the upward direction.

As shown in FIG. 1, a power storage pack 2 is installed near the center of the vehicle 1. A power control unit (PCU) 3 is installed in a front portion of the vehicle 1. The power storage pack 2 and the PCU 3 are connected to each other by a wire harness 4. The power storage pack 2 has a plurality of power storage elements 11. The power storage elements 11 may be secondary batteries such as nickel-hydrogen secondary batteries or lithium ion secondary batteries, or capacitors.

Power Storage Module 10

Figure 2:
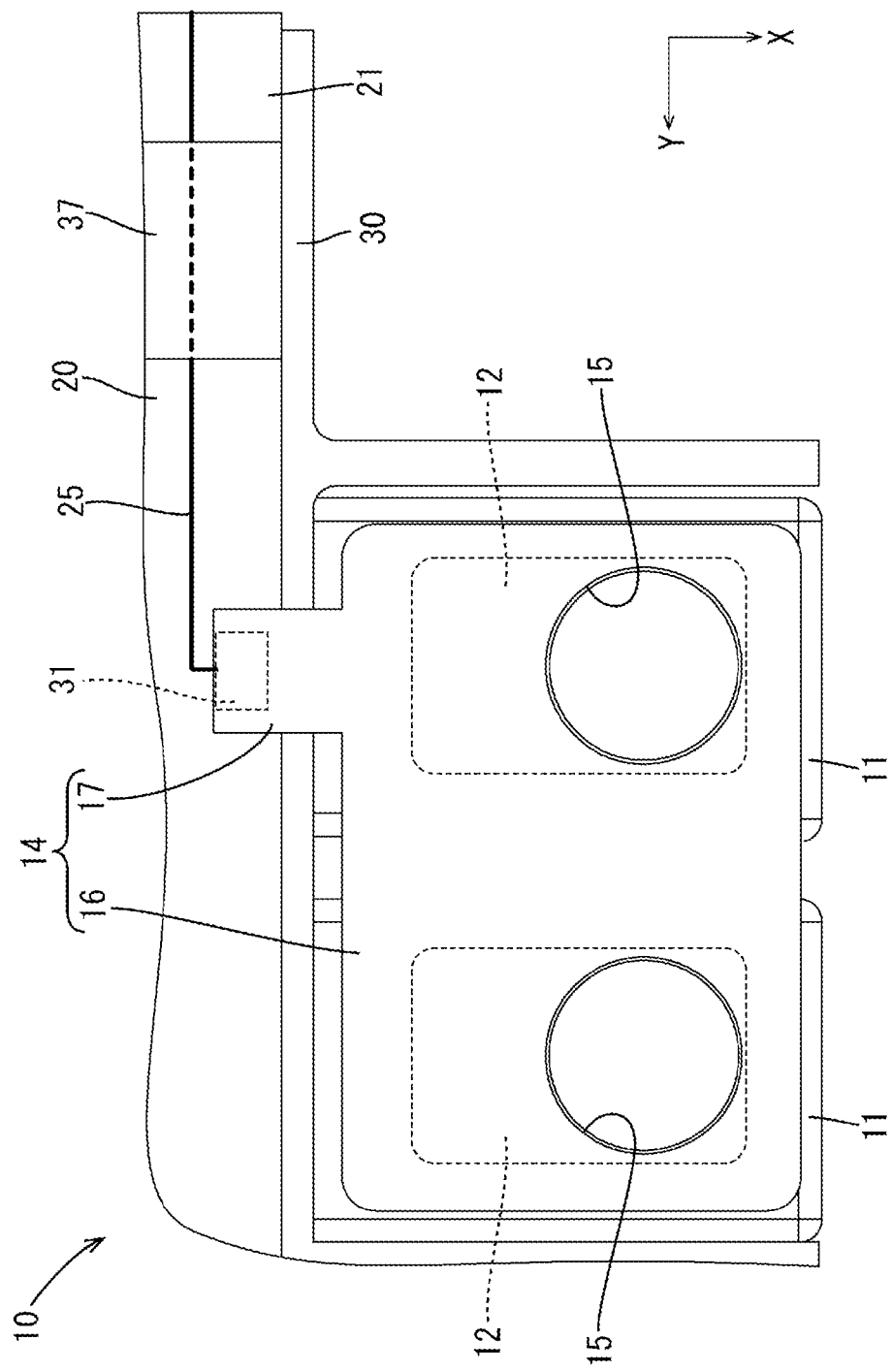
FIG. 2 is a partially enlarged plan view of the wiring module.

As shown in FIG. 2 (a portion of the power storage module 10 is shown in FIG. 2 while the rest is omitted), the power storage module 10 includes a plurality of power storage elements 11 arranged in the front-rear direction, a connection member 14 that connects two electrode portions 12 of adjacent power storage elements 11, and the wiring module 20 attached to the power storage elements 11.

As shown in FIG. 2, each power storage element 11 has a flat parallelopiped shape and includes an electrode portion 12 protruding from the upper surface thereof, and is a secondary battery such as a lithium-ion battery or a capacitor, for example. The upper surface of the electrode portion 12 has a flat rectangular shape, and the connection member 14 can be placed thereon. Adjacent power storage elements 11 are oriented such that adjacent electrode portions 12 have opposing polarities. That is, one of the adjacent electrode portions 12 is positive and the other is negative. The electrode portion 12 of the power storage element 11 located at one end among the power storage elements 11 is connected to a device such as the external PCU 3 via the wire harness 4.

Connection Member 14

As shown in FIG. 2, the connection member 14 is approximately rectangular, and is formed by a metal plate member made of copper, a copper alloy, aluminum, an aluminum alloy, stainless steel (SUS), or the like. The connection member 14 is large enough to cover a pair of adjacent electrode portions 12. The connection member 14 is fixed to the electrode portions 12 through laser welding. Circular welded portions 15 are formed on the connection member 14 subjected to laser welding. Note that one connection member 14 is shown in FIG. 2, but the power storage elements 11 can be connected in series or in parallel by a plurality of connection members 14. The connection member 14 has a body portion 16 that is rectangular as seen from above, and a protruding portion 17 that protrudes from the body toward a later described flexible printed wiring board. The welded portions 15 are formed on the body portion 16.

Wiring Module 20

As shown in FIG. 2, the wiring module 20 has a flexible printed wiring board 21. The flexible printed wiring board 21 is held by an insulating protector 30.

Flexible Printed Wiring Board 21

Figure 3:
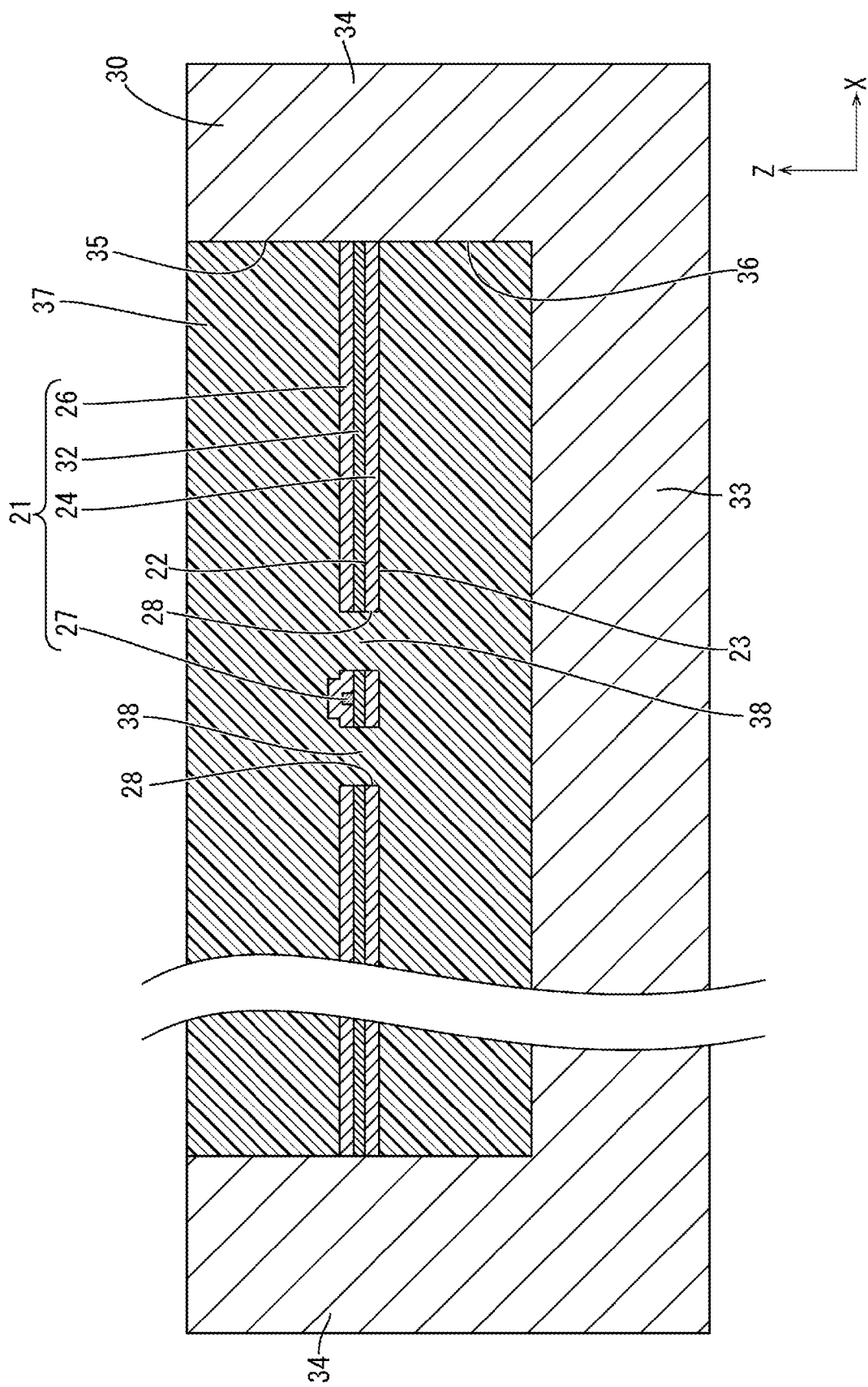
FIG. 3 is a cross-sectional view taken along line III-III in FIG. 7.

The flexible printed wiring board 21 of an embodiment of the present invention shown in FIG. 3 includes a base film 24, which has insulating properties and has an upper surface 22 (an example of a first surface) and a lower surface 23 (an example of a second surface), and a conductive path 25 stacked onto the upper surface 22 of the base film 24. Also, the flexible printed wiring board 21 includes an insulating coverlay 26 that is stacked so as to cover the upper surface 22 of the base film 24 and the upper surface of the conductive path 25.

Figure 4:
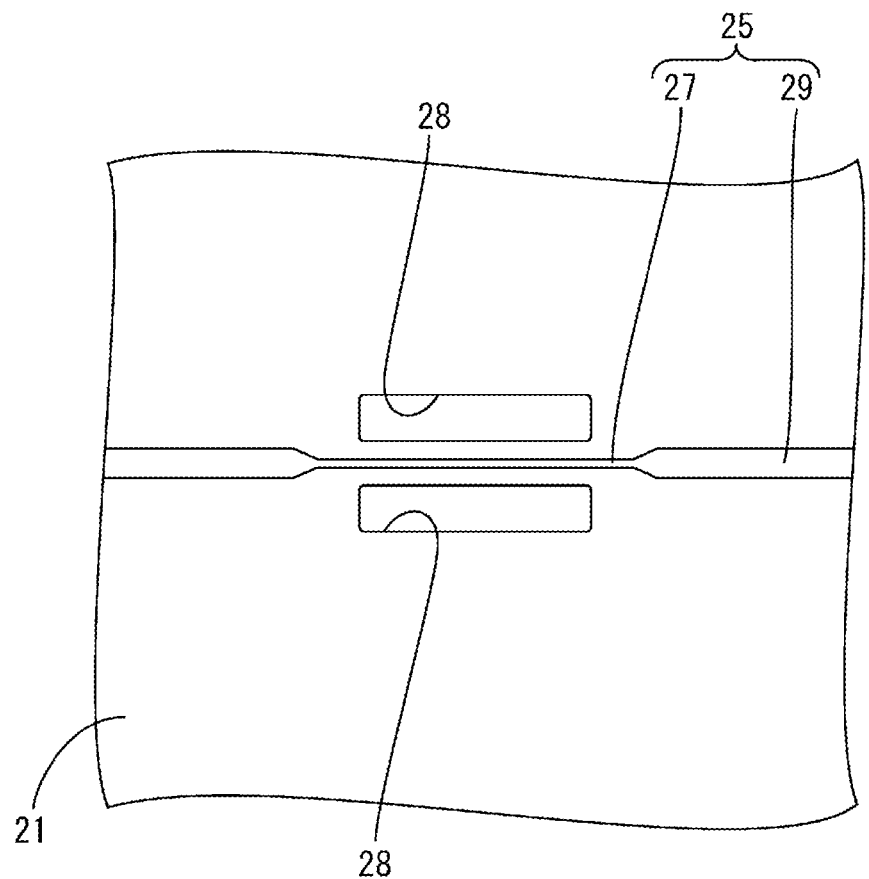
FIG. 4 is a partially enlarged plan view of a fuse portion.

As shown in FIG. 4, the flexible printed wiring board 21 has a fuse portion 27 whose cross-sectional area is smaller than the other portions of the conductive path 25 that forms part of a circuit. The fuse portion 27 is a portion that is formed so as to be melted by Joule heat when an overcurrent flows through the circuit. More specifically, the fuse portion 27 is a portion whose cross-sectional area is reduced so as to be melted by a current that flows when at least the power storage module 10 used for the circuit of the flexible printed wiring board 21 is directly connected to two ends of the fuse portion 27.

Furthermore, as seen in a plan view, the flexible printed wiring board 21 includes two through holes 28 that extend therethrough in the up-down direction on the left and right sides of the fuse portion 27 in the extension direction of the fuse portion 27. Specifically, each through hole 28 is a region where the base film 24, the conductive path 25, and an insulating layer are not present in a plan view. In the present embodiment, the two through holes 28 have the same shape and size.

Base Film 24

As shown in FIG. 3, the base film 24 is a member that supports the conductive path 25, and is a structural member that ensures the strength of the flexible printed wiring board 21.

As the main component of the base film 24, a synthetic resin such as polyimide or a liquid crystal polymer typified by a liquid crystal polyester can be used. Polyimide with its excellent thermal resistance properties is particularly preferable.

Conductive Path 25

The conductive path 25 is formed through patterning employing known printed wiring technology so as to at least form a layer-like conductor into a portion of a circuit. The conductive path 25 includes a wiring portion 29 that forms an electric path, and the fuse portion 27 where the width of a portion of the wiring portion 29 is reduced to make the cross-sectional area thereof smaller than the other portions of the wiring portion 29. Also, the conductive path 25 has a land 31 for soldering to the protruding portion 17 of the connection member 14 (see FIG. 2).

The material forming the conductive path 25 is not particularly limited, and it is sufficient that it is a material that has conductive properties and can be melted by Joule heat generated in response to electrical conduction, examples thereof including a metal such as copper, aluminum, or nickel, with copper that is cheap and has high electrical conductivity being commonly used. Also, the surface of the conductive path 25 may be subjected to plating processing.

The wiring portion 29 of the conductive path 25 is preferably shaped as a band having a substantially constant width. Note that substantially constant means that a deviation approximate to error that may occur in manufacturing is allowed, and any difference from the average width is preferably less than 10%.

Coverlay 26

As shown in FIG. 3, the coverlay 26 covers the upper surface of a stacked body including the base film 24 and the conductive path 25. The coverlay 26 mainly prevents the conductive path 25 from coming into contact with another member or the like and being damaged or causing a short-circuit.

The material of the coverlay 26 is not particularly limited, but a material similar to that of the resin film forming the base film 24 can be used, and polyimide may be used, for example.

The coverlay 26 is adhered to the upper surface 22 of the base film 24 by an adhesive layer 32 made of an adhesive. Thus, the adhesion layer 32 is provided between the coverlay 26 and the base film 24.

Fuse Portion 27

As shown in FIG. 4, the fuse portion 27 is formed by reducing the width of a portion of the wiring portion 29 so as to increase the electric resistance per unit length due to the cross-sectional area of the reduced portion being smaller than the other portions of the wiring portion 29, and so that the fuse portion 27 is heated and melted by Joule heat when exposed to an overcurrent. In other words, the fuse portion 27 has a smaller width than the portions of the wiring portion 29 on the front and rear sides of the fuse portion 27. The fuse portion 27 extends in the front-rear direction (an example of the direction in which the fuse portion extends).

Note that the cross-sectional area of the fuse portion 27 is set such that the fuse portion 27 is melted by a current that flows at least when the power storage module 10 is directly connected to two ends of the fuse portion 27. Preferably, the cross-sectional area of the fuse portion 27 is set such that the fuse portion 27 is melted by a melting current of a magnitude smaller than a current that flows when the power storage module 10 is directly connected thereto. More specifically, the melting current is set in consideration of the dielectric strength and the like of an element mounted on a circuit, for example, and, for the fuse portion 27 to be able to melt under this melting current, the cross-sectional area of the fuse portion 27 may be selected as needed in consideration of the physical properties of the material forming the conductive path 25, and the shape, physical properties, and the like of the materials forming the base film 24 and the insulating layer that have an effect on the amount of heat dissipated from the fuse portion 27.

Preferably, the cross-sectional area of the fuse portion 27 is smallest at the central portion in the longitudinal direction. Also, it is preferable that the portion of the fuse portion 27 where the width (cross-sectional area) is smallest is shaped as a band that extends in the longitudinal direction. Thus, it is possible to suppress the case where Joule heat generated at the central portion in the longitudinal direction of the fuse portion 27 is thermally transmitted in the front-rear direction and escapes to the wiring portion 29 on either side, and thus promote swift melting when an overcurrent flows through the fuse portion 27.

In FIG. 3, a configuration is shown where the adhesion layer 32 is not interposed between the fuse portion 27 and the coverlay 26, but the adhesion layer 32 may be interposed between the fuse portion 27 and the coverlay 26.

Through Hole 28

As shown in FIG. 4, two through holes 28 are respectively formed on two sides of the fuse portion 27 in a direction that is perpendicular to the direction in which a current flows through the fuse portion 27 as seen in a plan view. Also, the two through holes 28 are left-right symmetrical about the center of the fuse portion 27 in the longitudinal direction. Also, the through holes 28 preferably have a shape where the corner portions thereof are chamfered in order to avoid an increase in the likelihood of stress concentrating on and breaking the flexible printed wiring board 21. There are spaces between the side edges of the fuse portion 27 and corresponding side edges of the through holes 28. Each through hole 28 extends in the up-down direction through the base film 24, the adhesion layer 32, and the coverlay 26.

The through holes 28 keep heat from escaping from the fuse portion 27 in the left-right direction. Specifically, by reducing the thermal capacity of the surrounding region of the fuse portion 27, that is, reducing the volume of the base film 24 and the insulating layer present near the fuse portion 27 to prevent the diffusion of Joule heat generated by the fuse portion 27, the through holes 28 can speed up the melting of the fuse portion 27 when exposed to an overcurrent.

Also, by increasing the speed with which the fuse portion 27 melts, the length of time for which the adjacent base film 24 and the insulating layer are heated when the fuse portion 27 melts is also reduced, and thus carbonification of the base film 24 and the insulating layer can be suppressed. Accordingly, carbides generated when the fuse portion 27 melts can prevent electrical connection (short-circuiting) between the portions of the wiring portion 29 on the front and rear of the melted fuse portion 27 or between the wiring portion 29 and another circuit portion on the conductive path 25.

The through holes 28 are shorter than the fuse portion 27 in the longitudinal direction of the fuse portion 27. Thus, at two end portions of the fuse portion 27 in the longitudinal direction, the fuse portion 27 and the through holes 28 do not overlap each other in a direction that intersects the longitudinal direction of the fuse portion 27. By further reducing the thermal capacity of the base film 24 and the insulating layer near the central region of the fuse portion 27, in particular suppressing heat dissipation from the central region of the fuse portion 27, the through holes 28 induce melting at the central region of the fuse portion 27.

As described above, in order to enhance the effect of suppressing heat dissipation from the central region of the fuse portion 27, the side edges of the through holes 28 are formed parallel to the side edges of the fuse portion 27. As a result of the through holes 28 having side edges that are parallel to the side edges of the fuse portion 27, the diffusion of heat from the central region of the fuse portion 27 to the base film 24 and the insulating layer can be more effectively suppressed, melting of the central region of the fuse portion 27 can occur more reliably, and the fuse portion 27 can be melted faster.

It is preferable that the flexible printed wiring board 21 is formed such that there are spaces between the side edges of the through holes 28 and the side edges of the fuse portion 27. When the through holes 28 are formed in the stacked body of the base film 24, the conductive path 25, and the insulating layer, even if the through holes 28 are formed shifted relative to the conductive path 25, the spaces between the side edges of the through holes 28 and the side edges of the fuse portion 27 prevent a further reduction in the width (cross-sectional area) of the fuse portion 27 and an undesirable reduction in the magnitude of the current that melts the fuse portion 27. Also, by providing the spaces between the side edges of the through holes 28 and the side edges of the fuse portion 27, the base film 24 and the insulating layer can be adhered to each other on the left and right sides of the fuse portion 27, and exposure of the fuse portion 27 can be prevented. Accordingly, it is possible to prevent a short-circuit caused by the entrance of water or the like, for example.

Insulating Protector 30

As shown in FIG. 3, the insulating protector 30 is made of a synthetic resin with insulating properties. The insulating protector 30 has a bottom wall 33. The flexible printed wiring board 21 is placed on the upper surface of the bottom wall 33 with the lower surface of the flexible printed wiring board 21 facing down. Accordingly, the lower surface of the flexible printed wiring board 21 and the bottom wall 33 oppose each other.

As shown in FIG. 3, with the flexible printed wiring board 21 placed on the bottom wall 33, the insulating protector 30 has two side walls 34 that protrude upward from side edges of the bottom wall 33 in a region of the insulating protector 30 that corresponds to the fuse portion 27 of the flexible printed wiring board 21. The region formed between the bottom wall 33 and the two side walls 34 is a fuse housing portion 35 where the fuse portion 27 is housed.

Figure 5:
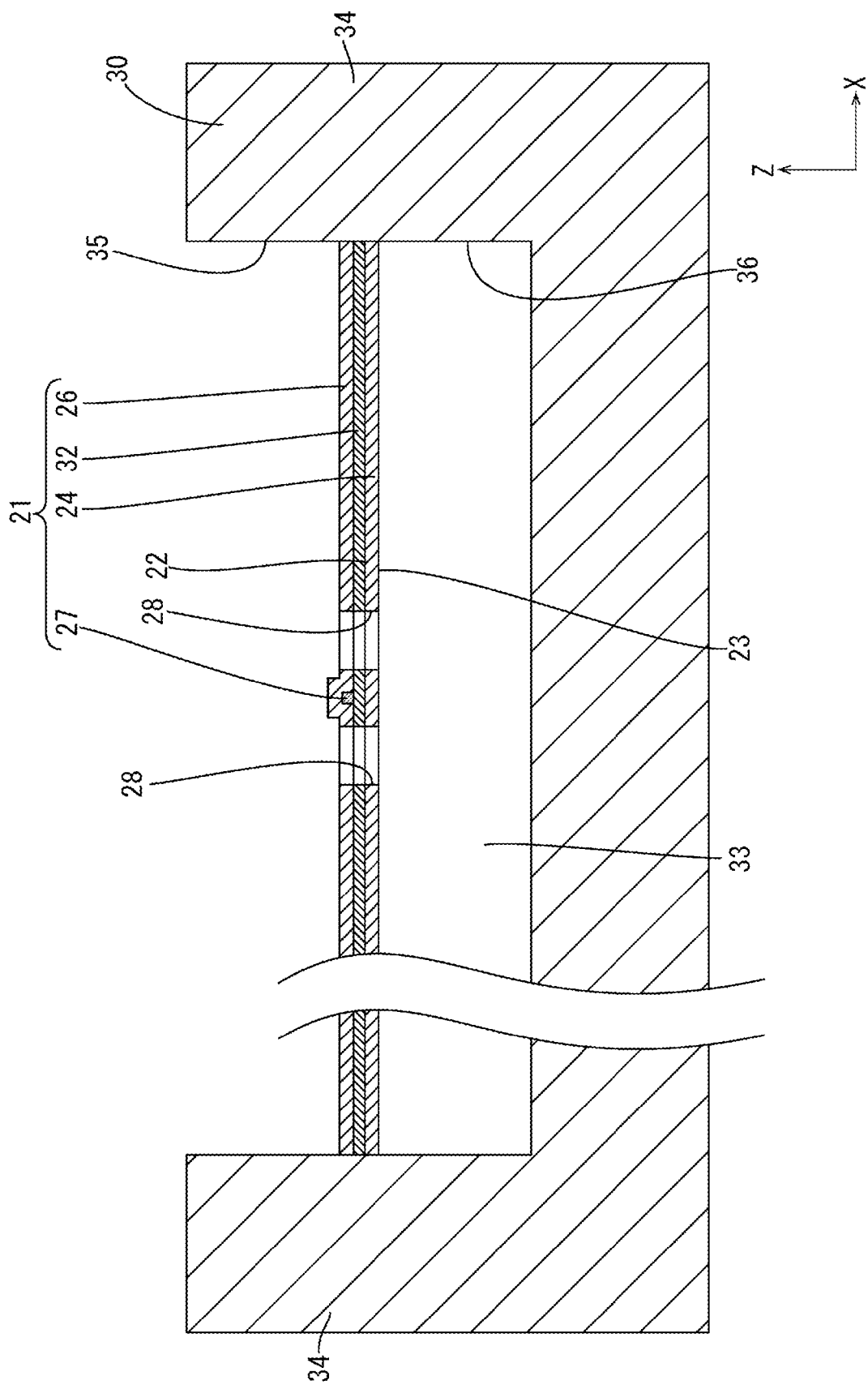
FIG. 5 is a partially enlarged cross-sectional view of the wiring module placed on an insulating protector, and corresponds to the cross-section taken along line III-III in FIG. 7.
Figure 6:
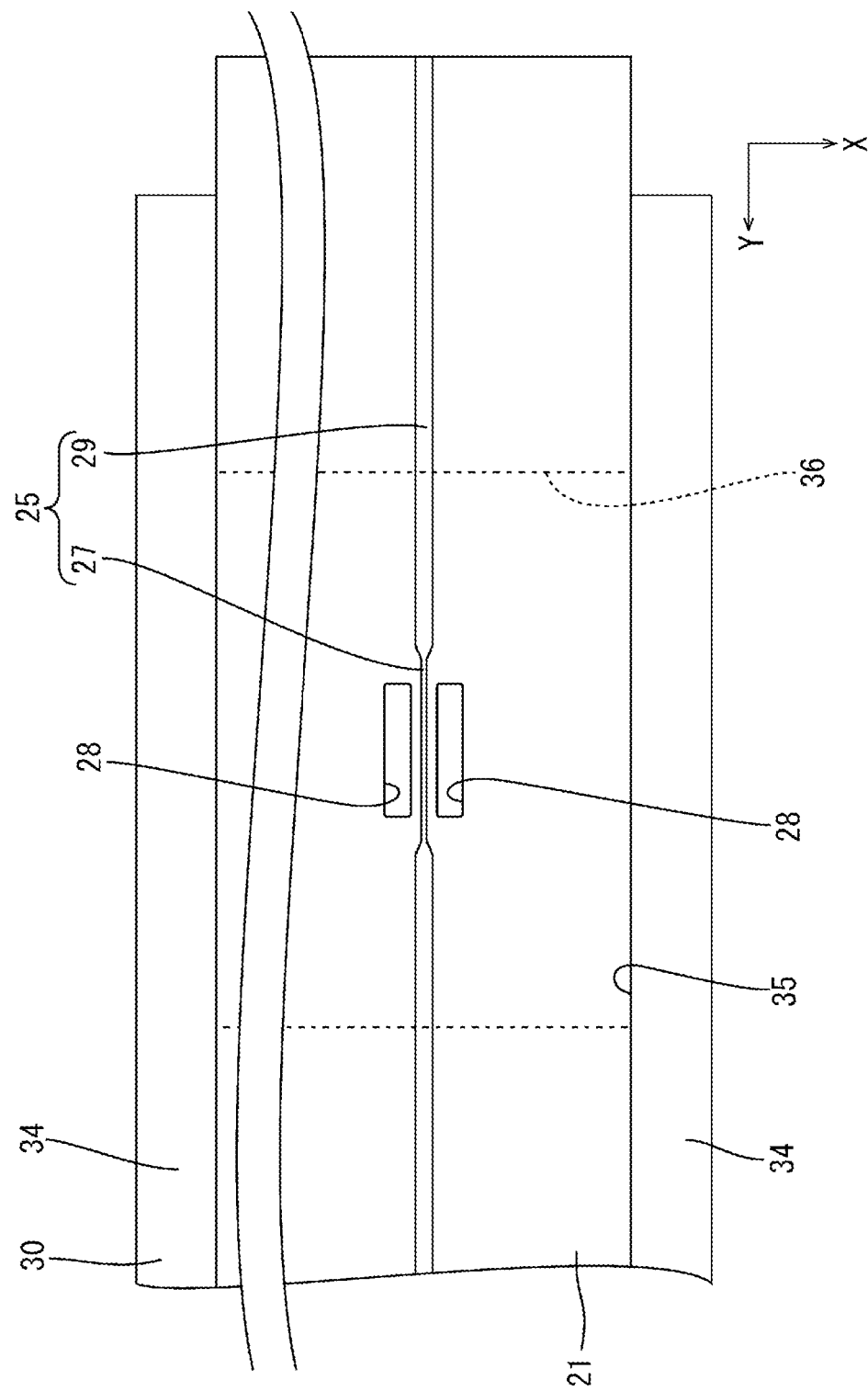
FIG. 6 is a partially enlarged plan view of the wiring module showing a fuse housing portion before a synthetic resin constituting a resin portion is poured thereinto.

As shown in FIGS. 5 and 6, the portion of the bottom wall 33 corresponding to the fuse housing portion 35 is provided with a groove portion 36 that is recessed downward at a position that corresponds to the fuse portion 27 of the flexible printed wiring board 21. The length of the groove portion 36 in the longitudinal direction of the fuse portion 27 is set to be larger than the length of the fuse portion 27.

Resin Portion 37

Figure 7:
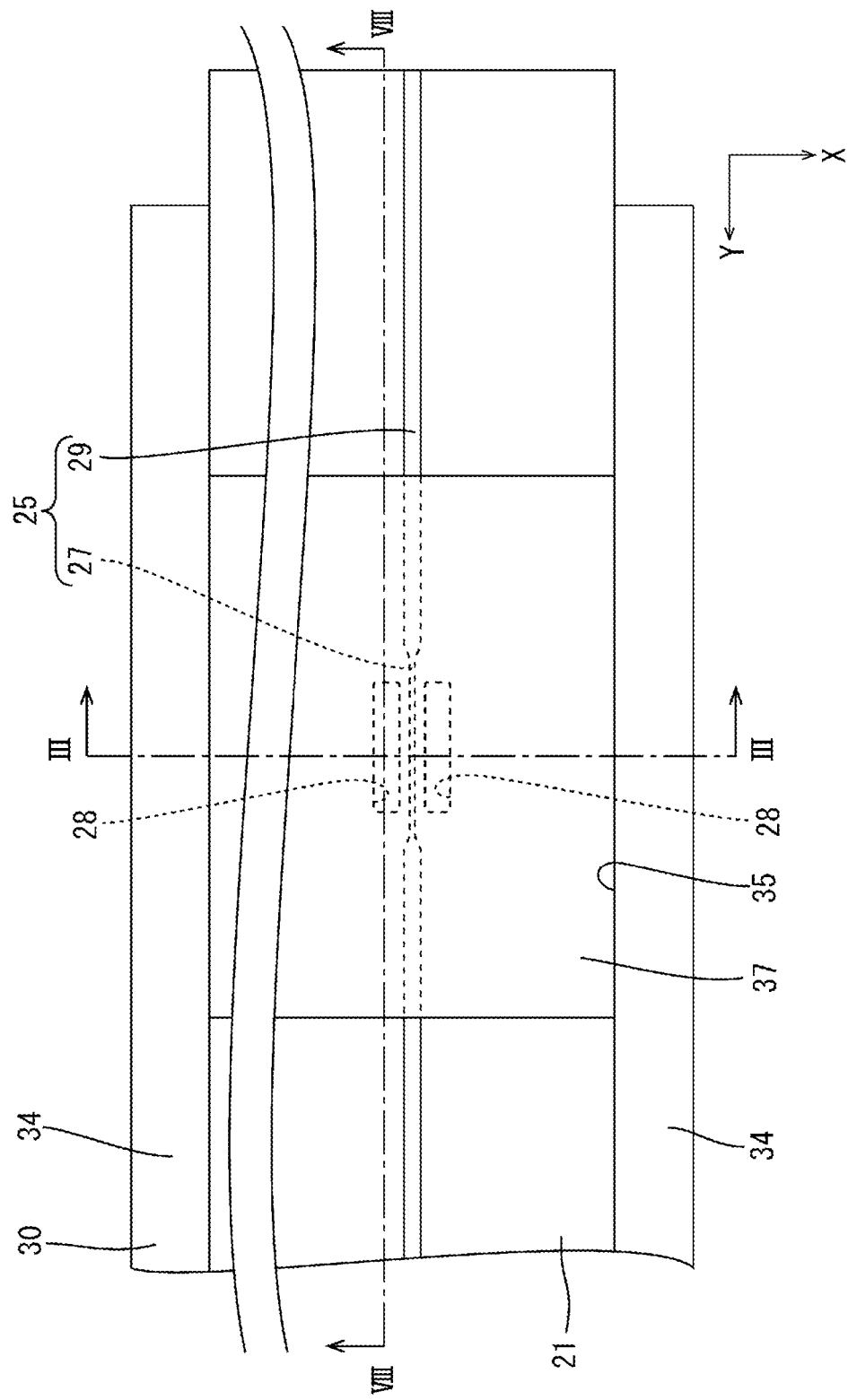
FIG. 7 is a partially enlarged plan view of the wiring module showing the fuse portion covered by the resin portion.

As shown in FIG. 7, in a state where the fuse portion 27 of the flexible printed wiring board 21 is housed in the fuse housing portion 35, a resin portion 37 including a synthetic resin with insulating properties is disposed in the fuse housing portion 35.

Figure 8:
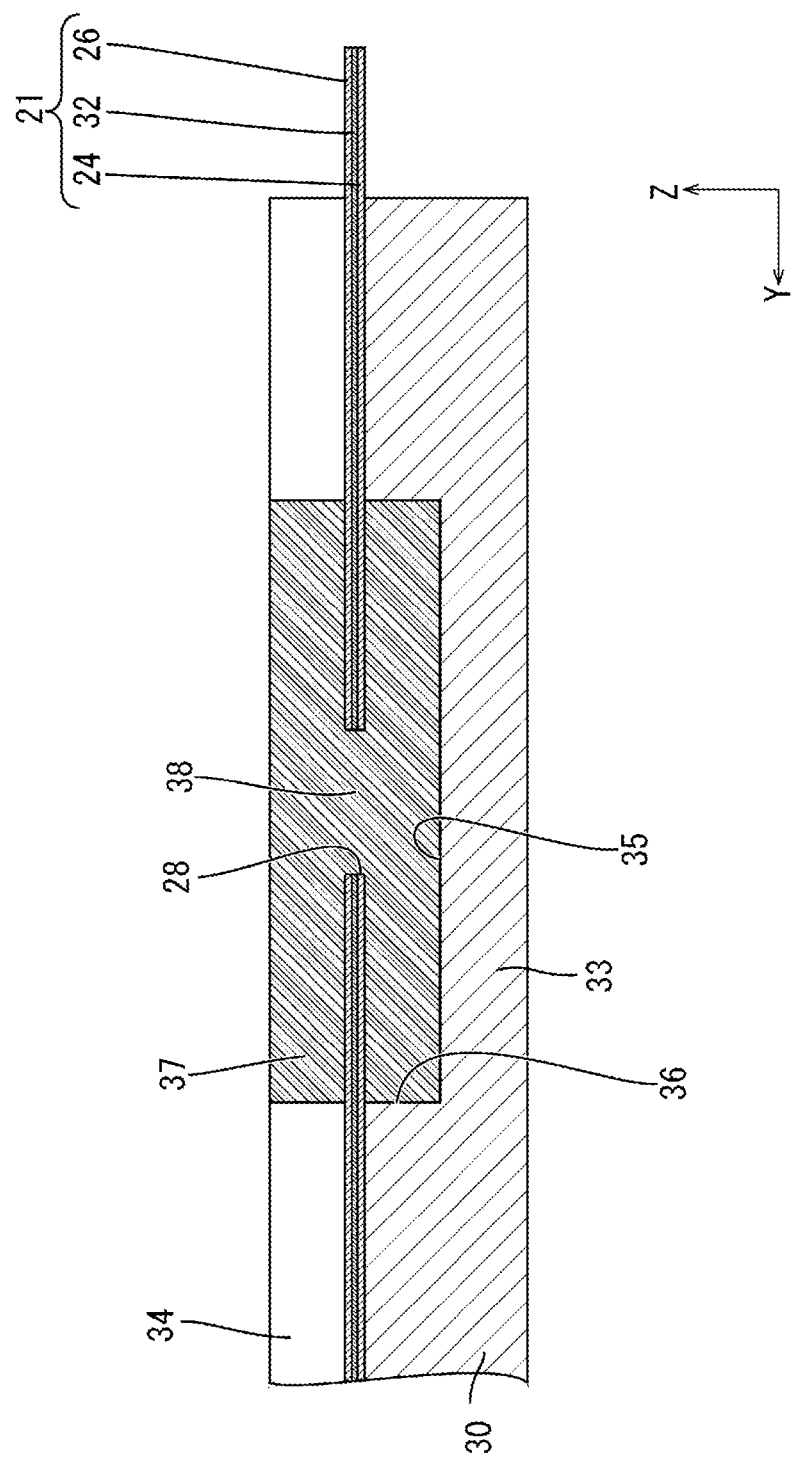
FIG. 8 is a cross-sectional view taken along line VIII-VIII in FIG. 7.

As shown in FIGS. 3 and 8, the resin portion 37 covers the upper portion of the fuse portion 27 on the upper surface of the coverlay 26 (an example of an outer surface). The resin portion 37 is in close contact with the upper surface of the coverlay 26. The upper end portion of the resin portion 37 is formed at approximately the same height as the upper edges of the two side walls 34. The upper end portion of the resin portion 37 may be lower than the upper edges of the two side walls 34, or slightly protrude past the upper edges of the two side walls 34.

The resin portion 37 is disposed inside the groove portion 36 of the insulating protector 30. Accordingly, the portion of the lower surface 23 of the base film 24 that corresponds to the fuse portion 27 is provided with the resin portion 37 and is covered by the resin portion 37.

While the synthetic resin forming the resin portion 37 is not particularly limited to being an ethylene-propylene copolymer elastomer, an ethylene-butene copolymer elastomer, an ethylene-propylene diene copolymer elastomer, a styrene-butadiene copolymer, a silicone resin, silicone modified resin, an epoxy resin, polytetrafluoroethylene, or the like, a silicone modified resin is preferable. The synthetic resin forming the resin portion 37 preferably has a Shore A hardness of 10 or more to 90 or less. By making the Shore A hardness 10 or more, moldability can be ensured. By making the Shore A hardness 90 or less, the resin portion 37 is imparted with flexibility, and it is possible to obtain an effect of avoiding a situation where the internal pressure of the resin portion 37 is increased by a gas generated when the fuse portion 27 melts thus causing the resin portion 37 itself to split due to its inability to withstand the increased internal pressure. The Shore A hardness is preferably 30 or more to 80 or less, and more preferably 40 or more to 70 or less. The Shore A hardness of the synthetic resin forming the resin portion 37 according to the present embodiment is measured based on JIS K6253.

Filling Resin Portion 38

A filling resin portion 38 that includes a synthetic resin with insulating properties is filled in the through holes 28 that extend through the base film 24, the adhesion layer 32, and the coverlay 26 in the up-down direction. The portion that fills the region of the internal space of each through hole 28 between the lower surface 23 of the base film 24 and the upper surface of the coverlay 26 is the filling resin portion 38. The upper end portion of the filling resin portion 38 is continuous with the resin portion 37 disposed on the upper surface of the coverlay 26, and the lower end portion of the filled resin portion 38 is continuous with the resin portion 37 disposed on the lower surface 23 of the base film 24. As the constituent resin forming the filling resin portion 38, the same resin as the synthetic resin forming the resin portion 37 is used.

Manufacturing Process of Present Embodiment

Next, an example of a manufacturing process of the present embodiment will be described. The manufacturing process of this aspect is not limited to that described below.

The conductive path 25 including the fuse portion 27 is formed through patterning performed on a conductor layer stacked on the upper surface 22 of the base film 24. In this process, it is possible to use a known method in which, for example, a resist pattern is formed using photolithography and the conductor layer is subjected to etching. Note that, an adhesive is used when stacking the base film 24 and the conductor layer forming the conductive path 25.

The coverlay 26 is stacked onto one surface of the stacked body of the base film 24 and the conductive path 25. In this process, for example, the coverlay 26 that has an adhesive on the lower surface thereof may be stacked on the upper surface 22 of the base film 24 and the upper surface of the stacked body of the conductive path 25, or the coverlay 26 may be stacked after the adhesive has been applied to the upper surface 22 of the base film 24. In order to reliably adhere the base film 24 and the coverlay 26 to each other on two sides of the fuse portion 27, it is preferable to use a vacuum heat compression bonding apparatus or the like.

The through holes 28 are formed in the stacked body of the base film 24, the conductive path 25, and the coverlay 26. In this process, the through holes 28 are formed on two sides of the fuse portion 27 through die-cutting using a puncher and a die, laser processing, or the like (see FIG. 4).

Figure 9:
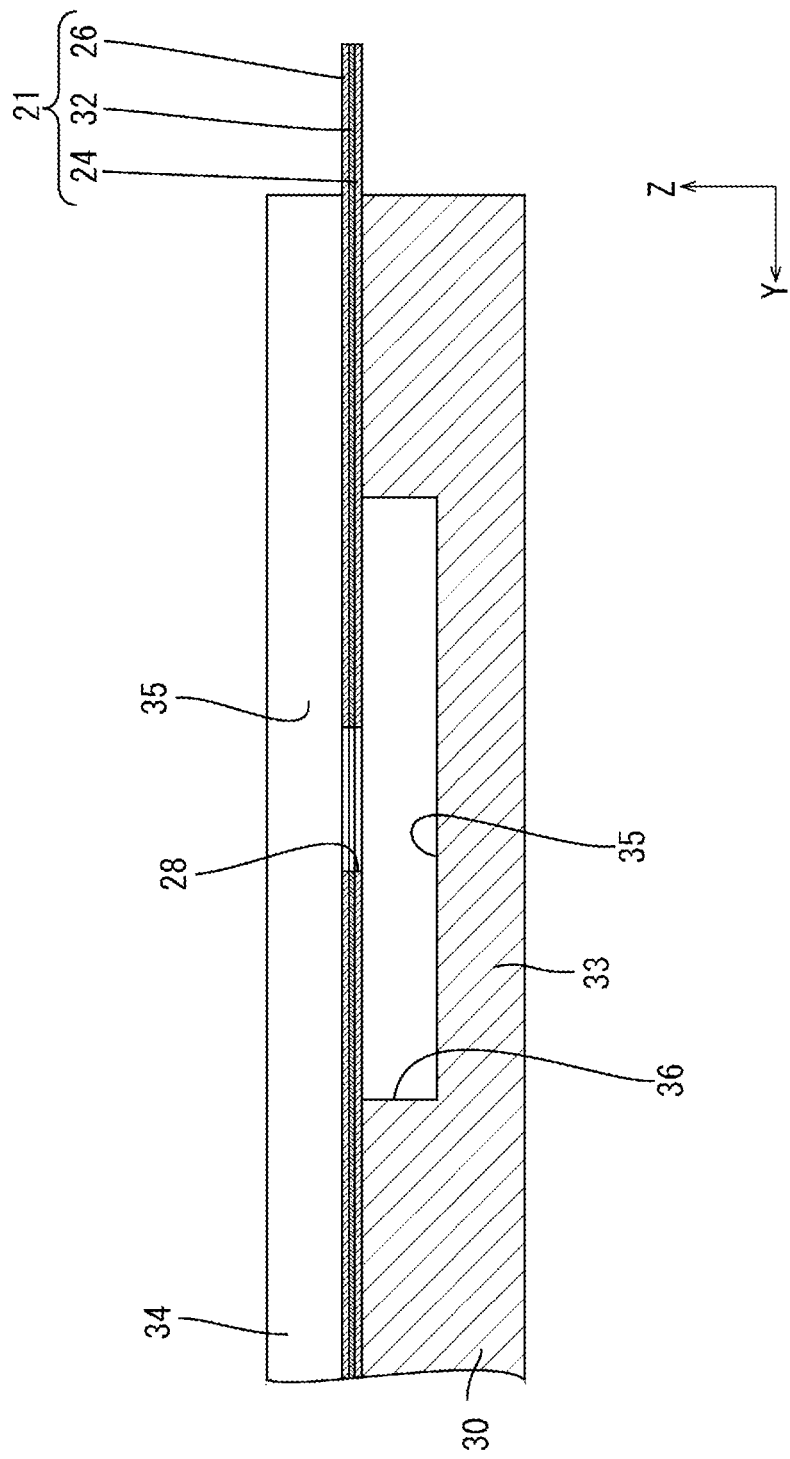
FIG. 9 is a partially enlarged cross-sectional view of the wiring module placed on the insulating protector, and corresponds to a cross-section taken along the line VIII-VIII in FIG. 7.

As shown in FIGS. 5 and 9, the flexible printed wiring board 21 is placed on the insulating protector 30. At this time, the fuse portion 27 of the flexible printed wiring board 21 is housed in the fuse housing portion 35.

In a state where the fuse portion 27 is housed in the fuse housing portion 35, the resin portion 37 and the filling resin portion 38 are poured into the fuse housing portion 35 while in a liquid state, using a known nozzle or the like. The liquid resin portion 37 is filled into the groove portion 36, the liquid filling resin portion 38 is filled into the through holes 28, and the liquid resin portion 37 also covers the upper and lower surfaces of the flexible printed wiring board 21. When the liquid resin portion 37 reaches the upper edge of the side walls 34 of the fuse housing portion 35, filling of the liquid resin portion 37 and the filling resin portion 38 is stopped. Then, the resin portion 37 and the filling resin portion 38 are hardened using a known method. During the hardening, any method such as radiational curing, addition of a curing agent, or irradiation using light with a predetermined frequency can be employed (see FIGS. 3 and 8).

The connection member 14 is soldered to the land 31 of the flexible printed wiring board 21. The soldering may be reflow soldering or soldering using a soldering iron, but any method can be employed.

The insulating protector 30 with the flexible printed wiring board 21 disposed thereon is placed onto the upper surfaces of the power storage elements 11. Then, the connection member 14 and the electrode portions 12 of the power storage elements 11 are laser welded to each other. Thus, the power storage module 10 is completed (see FIG. 2).

Operation and Effects of Present Embodiment

Next, operation and effects of the present embodiment will be described. The wiring module 20 of the present embodiment includes the flexible printed wiring board 21 that is to be electrically connected to a plurality of power storage elements 11. The flexible printed wiring board 21 has the base film 24 that has insulating properties and has the upper surface 22 and the lower surface 23, the adhesive layer 32 that has adhesive properties and is stacked onto the first surface of the base film 24, the conductive path 25 that is stacked onto the upper surface 22 of the base film 24 via the adhesive layer 32, and the coverlay 26 that is stacked onto the upper surface 22 of the base film 24 via the adhesive layer 32 and covers the first surface of the base film 24 and the conductive path 25. The conductive path 25 forms a part of a circuit, and has the fuse portion 27 that has a smaller cross-sectional area than the other parts of the conductive path 25. The resin portion 37 that includes a synthetic resin with insulating properties is formed on a portion of the lower surface 23 of the base film 24 that corresponds to the fuse portion 27 and a portion of the coverlay 26 that corresponds to the fuse portion 27.

When an overcurrent flows through the fuse portion 27, the temperature of the fuse portion 27 increases, thus melting the fuse portion 27. At this time, the temperature of the fuse portion 27 rises to a temperature that substantially coincides with the melting point of the metal forming the fuse portion 27. Thus, carbonization or damage to the base film 24 or the coverlay 26 is of concern. With the present embodiment, the resin portion 37 is formed on the portion of the lower surface 23 of the base film 24 that corresponds to the fuse portion 27, and on the portion of the coverlay 26 that corresponds to the fuse portion 27, and thus, even if the base film 24 or the coverlay 26 is carbonized or damaged, the melted fuse portion 27 is prevented from being exposed to the outside. Consequentially, it is possible to keep water from adhering to the melted fuse portion 27, and thus short-circuiting of the fuse portion 27 melted by an overcurrent can be suppressed.

With the present embodiment, the base film 24 and the coverlay 26 have at least one through hole 28 that extends through the base film 24 and the coverlay 26 at a position on a lateral side of the fuse portion 27 relative to the direction in which the fuse portion 27 extends, and the filling resin portion 38 that fills the through hole 28 and is continuous with the resin portion 37 is formed inside the through hole 28.

When an overcurrent flows through the fuse portion 27 and the fuse portion 27 melts, there are cases where a component included in the adhesive layer 32 that has a comparatively low melting point becomes a gas, and the gas builds up between the base film 24 and the coverlay 26. Thus, the gas may increase the pressure in the vicinity of the fuse portion 27. When the pressure in the vicinity of the fuse portion 27 increases, the fuse portion 27 is likely to break, and thus the fuse portion 27 may melt at a temperature below a predetermined temperature. With the present embodiment, even if the temperature of the fuse portion 27 increases and the components constituting the adhesive layer 32 that are quick to vaporize become a gas, the gas is discharged into the at least one through hole 28 formed in the base film 24 and the coverlay 26. The gas discharged into the through hole 28 is diffused in the filling resin portion 38, and also diffused into the resin portion 37 that is continuous with the filling resin portion 38. Accordingly, an increase in the pressure in the vicinity of the fuse portion 27 is suppressed, and thus the fuse portion 27 can melt at a predetermined temperature.

Also, with the present embodiment, through holes 28 are provided on two sides of the fuse portion 27.

Gas generated in the adhesive layer 32 is discharged into the through holes 28 formed on two sides of the fuse portion 27, and thus an increase in pressure in the vicinity of the fuse portion 27 can be further suppressed.

Also, with the present embodiment, the flexible printed wiring board 21 is disposed on the insulating protector 30 made of a synthetic resin with insulating properties. The insulating protector 30 has the bottom wall 33 and two side walls 34 that extend from side edges of the bottom wall 33, and the flexible printed wiring board 21 is disposed in the fuse housing portion 35 formed between the bottom wall 33 and the two side walls 34 of the insulating protector 30 such that the bottom surface of the flexible printed wiring board 21 opposes the bottom wall 33, and the resin portion 37 is disposed in the fuse housing portion 35.

The resin portion 37 can be kept from flowing out from the fuse housing portion 35 formed between the bottom wall 33 and the two side walls 34. Thus, interference between the resin portion 37 and a member disposed outside the fuse housing portion 35 can be suppressed.

Also, with the present embodiment, the bottom wall 33 of the insulating protector 30 is provided with a groove portion 36 that is recessed at a position that corresponds to the fuse portion 27, and the resin portion 37 is disposed in the groove portion 36.

By disposing the resin portion 37 in the groove portion 36, the lower surface of the flexible printed wiring board 21 can also be reliably covered by the resin portion 37.

Also, with the present embodiment, the resin portion 37 has a Shore A hardness of 10 or more to 90 or less.

By making the Shore A hardness 10 or more, moldability can be ensured. By making the Shore A hardness 90 or less, the resin portion 37 is imparted with flexibility, and it is possible to obtain an effect of avoiding a situation where the internal pressure of the resin portion 37 is increased by a gas generated when the fuse portion 27 melts thus causing the resin portion 37 itself to split due to its inability to withstand the increased internal pressure.

The wiring module 20 of the present embodiment is a vehicle wiring module 20 that is to be electrically attached to the power storage elements 11 mounted in the vehicle 1.

The power storage elements 11 are used as a driving source for the vehicle 1, and thus have a comparatively high voltage (about 300 V for example). The present aspect can be preferably used for such power storage elements 11.

Other Embodiments (1) There may be one or three or more through holes 28. Also, the through holes 28 may be omitted.
(2) A configuration may be employed where the resin portion 37 is only disposed on the upper surface of the flexible printed wiring board 21 and in the through holes 28, and the lower surface 23 of the base film 24 is exposed.
(3) The insulating protector 30 may be omitted from the wiring module 20.
(4) A configuration may be employed where the conductive path 25 is formed on both the upper surface 22 and the lower surface 23 of the base film 24.

LIST OF REFERENCE NUMERALS

1 Vehicle
2 Power storage pack
3 PCU
4 Wire harness
10 Power storage module
11 Power storage element
12 Electrode portion
14 Connection member
15 Welded portion
16 Body portion
17 Protruding portion
20 Wiring module
21 Flexible printed wiring board
22 Upper surface
23 Lower surface
24 Base film
25 Conductive path
26 Coverlay
27 Fuse portion
28 Through hole
29 Wiring portion
30 Insulating protector
31 Land
32 Adhesive layer
33 Bottom wall
34 Side wall
35 Fuse housing portion
36 Groove portion
37 Resin portion
38 Filling resin portion

The invention claimed is:

1. A wiring module comprising a flexible printed wiring board to be electrically connected to a plurality of power storage elements,
   wherein the flexible printed wiring board includes:
      a base film that has insulating properties and has a first surface and a second surface;
      an adhesive layer that has adhesive properties and is stacked onto the first surface of the base film;
      a conductive path that is stacked onto the first surface of the base film using the adhesive layer; and
      a coverlay that is stacked onto the first surface of the base film using the adhesive layer, and covers the first surface of the base film and the conductive path,
   the conductive path has a fuse portion forming a part of a circuit and having a smaller cross-sectional area than another part of the conductive path, and
   a resin portion that includes a synthetic resin with insulating properties is formed on a portion of the second surface of the base film that corresponds to the fuse portion, and on a portion of an outer surface of the coverlay that corresponds to the fuse portion.

2. The wiring module according to claim 1,
   wherein the base film and the coverlay have at least one through hole that extends through the base film and the coverlay at a position on a lateral side of the fuse portion relative to a direction in which the fuse portion extends, and
   a filling resin portion that fills the through hole and is continuous with the resin portion is formed inside the through hole.

3. The wiring module according to claim 2,
   wherein the through hole is formed on two lateral sides of the fuse portion.

4. The wiring module according to claim 1,
   wherein the flexible printed wiring board is disposed on an insulating protector made of a synthetic resin with insulating properties,
   the insulating protector has a bottom wall and two side walls that extend from side edges of the bottom wall,
   the flexible printed wiring board is disposed in a fuse housing portion formed between the bottom wall and the two side walls of the insulating protector such that the second surface of the base film opposes the bottom wall,
   and the resin portion is disposed in the fuse housing portion.

5. The wiring module according to claim 4,
   wherein the bottom wall of the insulating protector is provided with a groove portion that is recessed at a position that corresponds to the fuse portion, and
   the resin portion is disposed in the groove portion.

6. The wiring module according to claim 1,
   wherein the resin portion has a Shore A hardness of 10 or more and 90 or less.

7. The wiring module according to claim 1,
   wherein the wiring module is a vehicle wiring module that is to be electrically attached to the plurality of power storage elements mounted in a vehicle.

* * * * *